US012803542B2

(12) United States Patent
Galán et al.

(10) Patent No.: US 12,803,542 B2
(45) Date of Patent: Nov. 17, 2026

(54) COMBINATIONAL SUPERCONDUCTING GATE CIRCUIT

(71) Applicant: NORTHROP GRUMMAN SYSTEMS CORPORATION, Falls Church, VA (US)

(72) Inventors: Elias J. Galán, Baltimore, MD (US); Brian Michael Sears, Arvada, CO (US); Jacob L. Winter, Davidsonville, MD (US); Kamron Lawrence Strickland, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 19/065,687

(22) Filed: Feb. 27, 2025

(65) Prior Publication Data

US 2026/0254441 A1 Aug. 27, 2026

(51) Int. Cl.
*H03K 3/38* (2006.01)
*H03K 19/195* (2006.01)

(52) U.S. Cl.
CPC ............. *H03K 3/38* (2013.01); *H03K 19/195* (2013.01)

(58) Field of Classification Search
CPC ............................... H03K 3/38; H03K 19/195
USPC ............................... 326/3; 341/126; 327/527
See application file for complete search history.

(56) References Cited

U.S. PATENT DOCUMENTS

| | | | |
|---|---|---|---|
| 10,084,454 B1 * | 9/2018 | Braun | ..................... G11C 11/44 |
| 10,158,363 B1 | 12/2018 | Braun | |
| 2019/0019938 A1 | 1/2019 | Braun | |
| 2019/0238137 A1 | 8/2019 | Powell, III et al. | |

FOREIGN PATENT DOCUMENTS

WO 2019094160 A1 5/2019

OTHER PUBLICATIONS

WOISR issued May 15, 2026 for corresponding PCT/US2026/012666.

* cited by examiner

*Primary Examiner* — Arnold M Kinkead
(74) *Attorney, Agent, or Firm* — Renner Otto; Christopher P. Harris

(57) ABSTRACT

One example includes a superconducting gate circuit that includes an input stage comprising input JTL segments corresponding to respective logical inputs. Each of the logical inputs can receive a respective input pulse in a first state and to not receive the respective input pulse in a second state. Each of the logical inputs can be separately weighted based on circuit characteristics associated with the input JTL segments. The circuit also includes a logic operation stage that includes a decision Josephson junction. The logic operation stage performs a logic operation based on the first and second logic states of the logic input signals associated with the respective logical inputs. The decision Josephson junction triggers to provide a logic output signal having a first output logic state based on the logic operation or does not trigger to provide a logic output signal having a second logic output state based on the logic operation.

12 Claims, 5 Drawing Sheets

COMBINATIONAL SUPERCONDUCTING GATE CIRCUIT

GOVERNMENT INTEREST

The invention was made under Government Contract. Therefore, the US Government has rights to the invention as specified in that contract.

TECHNICAL FIELD

The present disclosure relates generally to superconducting circuits, and specifically to a combinational superconducting gate circuit.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nanowatts (nW), at a typical data rate of 20 gigabits per second (Gb/s) or greater, and operating temperatures of less than 4 Kelvin.

Logic gates are an important functional component of any computing system. A variety of logic gates are implemented for a variety of different logic operations, such as for Boolean logic. Aside from basic Boolean logic gates, other types of logic gates can provide important functions in a computing system. For example, a majority gate is a logical gate that returns true if and only if more than 50% of its inputs are true. As with CMOS computing devices, minimization of size and more compact layout of componentry are essential for designing more efficient superconducting computer systems.

SUMMARY

One example includes a superconducting gate circuit that includes an input stage comprising input JTL segments corresponding to respective logical inputs. Each of the logical inputs can receive a respective input pulse in a first state and to not receive the respective input pulse in a second state. Each of the logical inputs can be separately weighted based on circuit characteristics associated with the input JTL segments. The circuit also includes a logic operation stage that includes a decision Josephson junction. The logic operation stage performs a logic operation based on the first and second logic states of the logic input signals associated with the respective logical inputs. The decision Josephson junction triggers to provide a logic output signal having a first output logic state based on the logic operation or does not trigger to provide a logic output signal having a second logic output state based on the logic operation.

Another example includes a method for performing a logic operation. The method includes providing a reciprocal quantum logic (RQL) clock signal to a combinational superconducting gate circuit. The method also includes providing a plurality of logic input signals to a respective plurality of input JTL segments of an input stage. The input JTL segments corresponding to a respective plurality of logical inputs of the superconducting gate circuit. Each of the logic input signals can correspond to a presence of an RQL pulse in a first logic state and an absence of the RQL pulse in a second logic state. Each of the logical inputs being separately weighted in importance based on circuit characteristics associated with each of the respective input JTL segments. The method also includes propagating an output RQL pulse from an output of the combinational superconducting gate in a first output logic state associated with a logic operation in response to triggering of a decision Josephson junction of a logic operation stage and propagating no output RQL pulse from the output of the combinational superconducting gate in a second output logic state associated with the logic operation in response to not triggering the decision Josephson junction of the logic operation stage. The first and second output logic states of the logic operation can be provided in response to the respective first or second logic states associated each of the logic input signals and based on the separately weighted logical inputs.

Another example includes a combinational RQL gate circuit. The circuit includes an input stage comprising a plurality of input JTL segments corresponding to a respective plurality of logical inputs. Each of the input JTL segments can include an input Josephson junction and a storage inductor. Each of the logical inputs can be configured to receive a respective RQL input pulse in a first logic state and to not receive the respective RQL input pulse in a second logic state. Each of the logical inputs can be separately weighted in importance based on at least one of a critical current of the input Josephson junction and an inductance of the storage inductor of the respective one of the input JTL segments. The circuit also includes a logic operation stage comprising a decision Josephson junction. The logic operation stage can be configured perform a logic operation based on a combination of the first and second logic states associated with the respective logical inputs, such that the decision Josephson junction is configured to trigger to provide an RQL output pulse in a first output logic state associated with the logic operation or to not trigger to not provide the RQL output pulse in a second output logic state associated with the logic operation.

DETAILED DESCRIPTION

Figure 1:
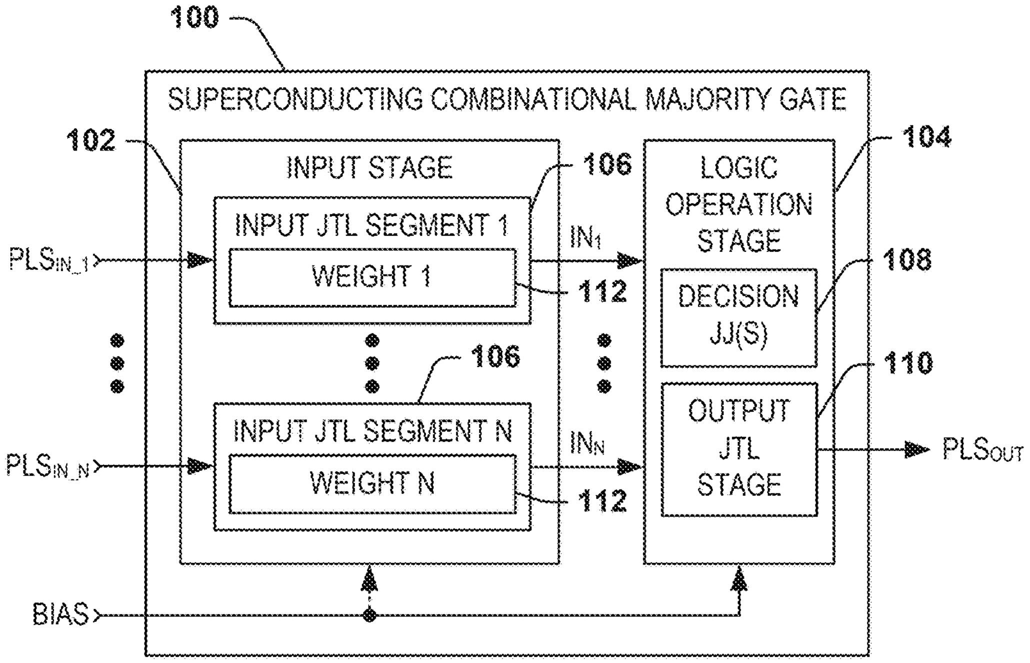
FIG. 1 is an example block diagram of a superconducting gate circuit.

This present disclosure relates generally to superconducting circuits, and specifically to a combinational superconducting gate circuit. A combinational superconducting gate circuit (hereinafter "superconducting gate circuit") can be implemented in any of a variety of superconducting circuit applications, such as reciprocal quantum logic (RQL) to provide one or more logic functions. The superconducting gate circuit include an input stage and a logic operation stage. The input stage includes a plurality of Josephson transmission line (JTL) segments that can each correspond to a separate logical input of the superconducting gate circuit, with each logical input being configured to receive a logic input signal. As described herein, the term "logic input signal" refers to superconducting signals provided as pulses (e.g., single flux quantum (SFQ) pulses or RQL pulses). Therefore, a "logic input signal" has a first logic state corresponding to the presence of a superconducting pulse and a second logic state corresponding to the absence of a superconducting pulse.

The logic input signals provided to the input stage are subsequently provided to the logic operation stage, at which the logic operation stage is configured to perform a logic operation on the logic input signals. As an example, the logic operation stage includes a decision Josephson junction that is configured to trigger or not trigger based on the respective logic states of the logic input signals to provide a logic output signal that has a first logic output state or a second logic output state, respectively, based on the logic operation. From a superconducting circuit standpoint, the decision Josephson junction can be tuned to have a critical current that can be exceeded by a combination of the logic states of the logic input signals, such that the decision Josephson junction triggers to provide the logic output signal in the first output logic state, or does not trigger based on the logic states of the input logic signals being insufficient to exceed the critical current, thereby providing the logic output signal having the second output logic state.

As described herein, the logic inputs of the input stage can be separately respectively weighted in importance. As described herein, the terms "weighted" and "weighted in importance" refers to disparate circuit effects of the respective logic input with respect to priority or importance in determining triggering of the decision Josephson junction. Therefore, a higher/heavier weighting of a respective one of the logic inputs can correspond to a higher flux provided from the respective logic input to the logic operation stage. The weighting of a logical input can be defined based on circuit characteristics of the respective input JTL segment of the input stage. As an example, each of the input JTL segments can include an input Josephson junction and a storage inductor. For example, the weighting of the input JTL segment can thus be based on a critical current of the input Josephson junction and/or the inductance of the storage inductor. Alternatively or additionally, the weighting of the input JTL segment can be based on a quantity of input Josephson junctions and storage inductors in the respective input JTL segment.

For example, the superconducting gate circuit can be fabricated as a majority gate, such that a majority of the logic inputs to the logic operation stage that are true (e.g., logic-high) can result in a logic output signal that is also true. However, based on the weighting of the logic inputs, one or more of the logic inputs can have sufficient weighting alone to provide the logic output signal as likewise true, or to have greater weighting than a combined weight of two or more other logic inputs. As another example, based on the weighting of the logic inputs of the input stage, the input stage can be fabricated to provide logic functions separate from the logic function provided by the logic operation stage, such that the separate logic functions can be resolved before the triggering or not triggering of the decision Josephson junction. For example, two or more logic inputs can be arranged as a Boolean logic gate (e.g., AND-gate or OR-gate), such that the output of the Boolean logic gate can be provided as a single input to the logic operation stage along with the logic input signals from other logic inputs for the logic operation provided by the logic operation stage. Accordingly, the superconducting gate circuit can be fabricated in any of a variety of ways to provide a more efficient layout and operation of multiple logic operation in a single gate circuit.

FIG. 1 is an example block diagram of superconducting gate circuit 100. The superconducting gate circuit 100 can be implemented in any of a variety of superconducting circuits to provide one or more logic functions. For example, the superconducting gate circuit 100 can be implemented in an RQL circuit to provide an RQL logic output signal in response to a combination of RQL logic input signals.

The superconducting gate circuit 100 include an input stage 102 and a logic operation stage 104. The input stage 102 includes a plurality N of input Josephson transmission line (JTL) segments 106, where N is a positive integer, that can each correspond to a separate logical input of the superconducting gate circuit 100. Each of the input JTL segments 106, and thus each of the logical inputs, is configured to receive a logic input signal, demonstrated in the example of FIG. 1 as signals $PLS_{IN\_1}$ through $PLS_{IN\_N}$, respectively. As described herein, the logic input signals $PLS_{IN\_1}$ through $PLS_{IN\_N}$ can each have a first logic state (e.g., presence of a pulse) or a second logic state (e.g., absence of a pulse).

The logic input signals $PLS_{IN\_1}$ through $PLS_{IN\_N}$ can be provided from the respective input JTL segments 106 as signals $IN_1$ through $IN_N$, respectively, to the logic operation stage 104. Each of the input JTL segments 106 can, for example, include an input Josephson junction and a storage inductor. Therefore, a respective input JTL segment 106 can propagate a signal INX, where X is an index, as the presence of a pulse in response to the logic input signal triggering the respective input Josephson junction or as the absence of a pulse in response to the logic input signal not triggering the respective input Josephson junction.

The logic operation stage 104 is configured to perform a logic operation on the logic input signals $PLS_{IN\_1}$ through $PLS_{IN\_N}$. In the example of FIG. 1, the logic operation stage 104 includes one or more decision Josephson junctions 108 that are configured to trigger or not trigger based on the respective logic states of the logic input signals $PLS_{IN\_1}$ through $PLS_{IN\_N}$ to provide a logic output signal $PLS_{OUT}$. The logic output signal $PLS_{OUT}$ therefore has a first logic output state or a second logic output state based on the logic operation. In the example of FIG. 1, the logic operation stage 104 can also include an output JTL segment 110 that is configured to propagate the logic output pulse $PLS_{OUT}$ from the superconducting gate circuit 100.

For example, the decision Josephson junction(s) 108 can be tuned to have a critical current that can be determinative of the logic output state of the logic output signal $PLS_{OUT}$ based on an applied bias, demonstrated in the example of FIG. 1 as a signal BIAS. As an example, the signal BIAS can correspond to an RQL clock signal to provide bias to the decision Josephson junction(s) 108 at a specific phase-range of the period of the RQL clock signal. Therefore, if the combination of the logic states of the logic input signals $PLS_{IN\_1}$ through $PLS_{IN\_N}$ and the bias signal BIAS exceeds the critical current of the decision Josephson junction(s) 108, the decision Josephson junction(s) 108 trigger to provide the logic output signal in the first output logic state. Alternatively, if the combination of the logic states of the logic input signals $PLS_{IN\_1}$ through $PLS_{IN\_N}$ and the bias signal BIAS does not exceed the critical current of the decision Josephson junction(s) 108, the decision Josephson junction(s) 108 do not trigger, thereby providing the logic output signal having the second output logic state.

In the example of FIG. 1, each of the input JTL segments 106 includes a respective weight 112. The weight 112 can correspond to a separate priority or importance of the logical input corresponding to the respective input JTL segment 106. Therefore, a more heavily weighted logical input can provide the signal INX as having higher flux to the logic operation stage 104. Therefore, the signal INX having higher flux can provide a greater contribution of flux to the determination of whether one or more of the decision Josephson junction(s) 108 trigger to determine the output of the logic operation provided by the logic operation stage 104.

The weight 112 of a logical input can be defined based on circuit characteristics of the respective input JTL segment 106 of the input stage 102. As an example, the weight 112 of the input JTL segment 106 can thus be based on a critical current of the input Josephson junction and/or the inductance of the storage inductor therein. Alternatively or additionally, the weight 112 of the input JTL segment 106 can be based on a quantity of input Josephson junctions and storage inductors in the respective input JTL segment. As described in greater detail herein, the weights 112 can provide for a variety of ways to incorporate signal priority and/or additional logic operations to the superconducting gate circuit 100 to provide greater efficiency in spatial and operational constraints for the superconducting gate circuit 100.

Figure 2:
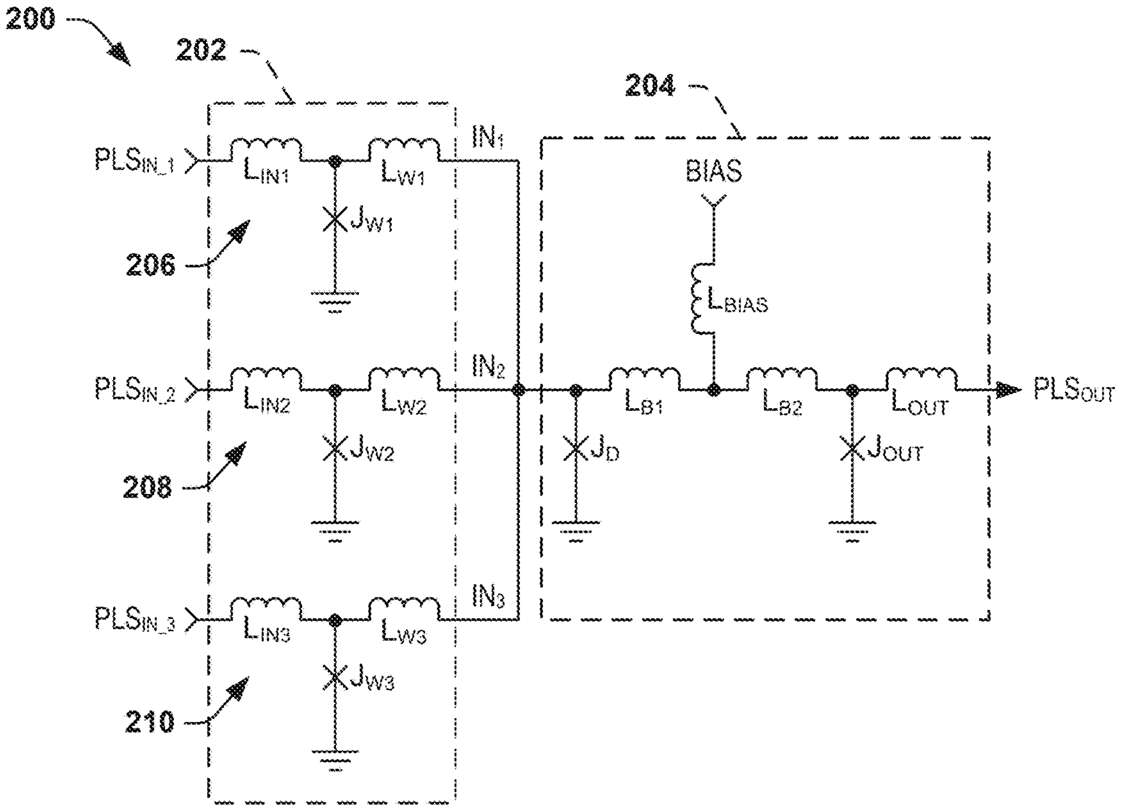
FIG. 2 is an example of a superconducting gate circuit.

FIG. 2 is an example of a superconducting gate circuit 200. The superconducting gate circuit 200 can correspond to the superconducting gate circuit 100 in the example of FIG. 1. Therefore, reference is to be made to the example of FIG. 1 in the following description of the example of FIG. 2.

The superconducting gate circuit 200 include an input stage 202 and a logic operation stage 204. The input stage 202 includes a first input JTL segments 206, a second input JTL segment 208, and a third input JTL segment 210. Each of the input JTL segments 206, 208, and 210, and thus each of the logical inputs, is configured to receive a respective one of three logic input signals, demonstrated in the example of FIG. 2 as signals $PLS_{IN\_1}$, $PLS_{IN\_2}$, and $PLS_{IN\_3}$, respectively. As described herein, the logic input signals $PLS_{IN\_1}$, $PLS_{IN\_2}$, and $PLS_{IN\_3}$ can each have a first logic state (e.g., presence of a pulse) or a second logic state (e.g., absence of a pulse).

The first input JTL segment 206 includes an input inductor $L_{IN1}$, an input Josephson junction $J_{W1}$, and a storage inductor $L_{W1}$, the second input JTL segment 208 includes an input inductor $L_{IN2}$, an input Josephson junction $J_{W2}$, and a storage inductor $L_{W2}$, and the third input JTL segment 210 includes an input inductor $L_{IN3}$, an input Josephson junction $J_{W3}$, and a storage inductor $L_{W3}$. The logic input signal $PLS_{IN\_1}$ is provided to the first input JTL segment 206, such that if the logic input signal $PLS_{IN\_1}$ is provided at a first logic state, and thus is provided as a pulse through the input inductor $L_{IN1}$, the input Josephson junction $J_{W1}$ can trigger to provide a pulse through the storage inductor $L_{W1}$, thus providing a corresponding signal $IN_1$ at the first logic state (e.g., a pulse) to the logic operation stage 204. If the logic input signal $PLS_{IN\_1}$ is provided at a second logic state, and thus is provided as no pulse, the input Josephson junction $J_{W1}$ does not trigger, thus providing a corresponding signal $IN_1$ at the second logic state (e.g., no pulse) to the logic operation stage 204.

Similarly, the logic input signal $PLS_{IN\_2}$ is provided to the second input JTL segment 208, such that if the logic input signal $PLS_{IN\_2}$ is provided at a first logic state, and thus is provided as a pulse through the input inductor $L_{IN2}$, the input Josephson junction $J_{W2}$ can trigger to provide a pulse through the storage inductor $L_{W2}$, thus providing a corresponding signal $IN_2$ at the first logic state (e.g., a pulse) to the logic operation stage 204. If the logic input signal $PLS_{IN\_2}$ is provided at a second logic state, and thus is provided as no pulse, the input Josephson junction $J_{W2}$ does not trigger, thus providing a corresponding signal $IN_2$ at the second logic state (e.g., no pulse) to the logic operation stage 204.

Similarly, the logic input signal $PLS_{IN\_3}$ is provided to the third input JTL segment 210, such that if the logic input signal $PLS_{IN\_3}$ is provided at a first logic state, and thus is provided as a pulse through the input inductor $L_{IN3}$, the input Josephson junction $J_{W3}$ can trigger to provide a pulse through the storage inductor $L_{W3}$, thus providing a corresponding signal $IN_3$ at the first logic state (e.g., a pulse) to the logic operation stage 204. If the logic input signal $PLS_{IN\_3}$ is provided at a second logic state, and thus is provided as no pulse, the input Josephson junction $J_{W3}$ does not trigger, thus providing a corresponding signal $IN_3$ at the second logic state (e.g., no pulse) to the logic operation stage 204.

In the example of FIG. 2, the logic operation stage 204 includes a decision Josephson junction $J_D$, and inductor $L_{B1}$, an inductor $L_{B2}$, an output Josephson junction $J_{OUT}$, and an output inductor $L_{OUT}$. A bias signal BIAS is provided to the inductors $L_{B1}$ and $L_{B2}$ through a bias inductor $L_{BIAS}$ to provide a bias to the respective decision and output Josephson junctions $J_D$ and $J_{OUT}$. As an example, the bias signal BIAS can be an RQL clock signal to provide the bias for the decision and output Josephson junctions $J_D$ and $J_{OUT}$ at a specific phase-range of the RQL clock signal. The inductors $L_{B1}$ and $L_{B2}$, the output Josephson junction $J_{OUT}$, and the output inductor $L_{OUT}$ can cooperate with the bias signal BIAS to form an output JTL segment (e.g., the output JTL segment 110) to provide the logic output signal $PLS_{OUT}$.

As an example, the superconducting gate circuit 200 can be configured as a majority gate. Nominally, for equal weights associated with each of the first, second, and third input JTL segments 206, 208, and 210, the superconducting gate circuit 200 operating as a majority gate provides the logic output signal $PLS_{OUT}$ at a first output logic state (e.g., a pulse) in response to two or more of the logic input signals $PLS_{IN\_1}$, $PLS_{IN\_2}$, and $PLS_{IN\_3}$ being provided at the first logic state (e.g., a pulse).

For example, the decision Josephson junction $J_D$ can have a critical current that is tuned such that the combined flux of at least two of the signals $IN_1$, $IN_2$, and $IN_3$, and thus at least two of the logic input signals $PLS_{IN\_1}$, $PLS_{IN\_2}$, and $PLS_{IN\_3}$, are sufficient to trigger the decision Josephson junction $J_D$. Thus, the triggering of the decision Josephson junction $J_D$ can provide a pulse that is propagated through the output JTL segment 110 formed via the inductors $L_{B1}$ and $L_{B2}$, the output Josephson junction $J_{OUT}$, and the output inductor $L_{OUT}$ as the logic output signal $PLS_{OUT}$ in the first logic state (e.g., a pulse). Conversely, if less than two of the logic input signals $PLS_{IN\_1}$, $PLS_{IN\_2}$, and $PLS_{IN\_3}$, are provided at the second logic state (e.g., no pulse), the combined flux is insufficient to trigger the decision Josephson junction $J_D$. Thus, the no pulse is provided from the decision Josephson junction $J_D$, and the logic output signal $PLS_{OUT}$ is provided in the second logic state (e.g., no pulse).

As described above in the example of FIG. 1, the input JTL segments 206, 208, and 210 can be separately respectively weighted. For example, the weight of the input JTL segments 206, 208, and 210 can be based on respective critical currents of the input Josephson junctions $J_{W1}$, $J_{W2}$, and $J_{W3}$ and/or the respective inductances of the storage inductors $L_{W1}$, $L_{W2}$, and $L_{W3}$. Therefore, one or more of the input JTL segments 206, 208, and 210 can provide a different amount of flux with respect to the signals $IN_1$, $IN_2$, and $IN_3$ in response to triggering of the respective input Josephson junctions $J_{W1}$, $J_{W2}$, and $J_{W3}$. Such disparity in weights of the input JTL segments 206, 208, and 210 can provide for varied logic operations of the majority gate function of the superconducting gate circuit 200.

As an example, the superconducting gate circuit 200 can have one of the input JTL segments 206, 208, and 210 with the heaviest weight exhibit priority over the other two of the input JTL segments 206, 208, and 210. Therefore, the heaviest weighted one of the input JTL segments 206, 208, and 210 can provide sufficient flux via the respective one of the signals $IN_1$, $IN_2$, and $IN_3$ alone to trigger the decision Josephson junction $J_D$, while the other two of the input JTL segments 206, 208, and 210 cannot provide sufficient flux alone, but can provide sufficient flux together, to trigger the decision Josephson junction $J_D$. Accordingly, the separate weighting of the input JTL segments 206, 208, and 210 can provide for variability of operation of the logic function(s) provided by the logic operation stage 204. As described in greater detail herein, the separate weighting of the input JTL segments 206, 208, and 210 can provide for additional logic operations that can be performed by the superconducting gate circuit 200.

Figure 3:
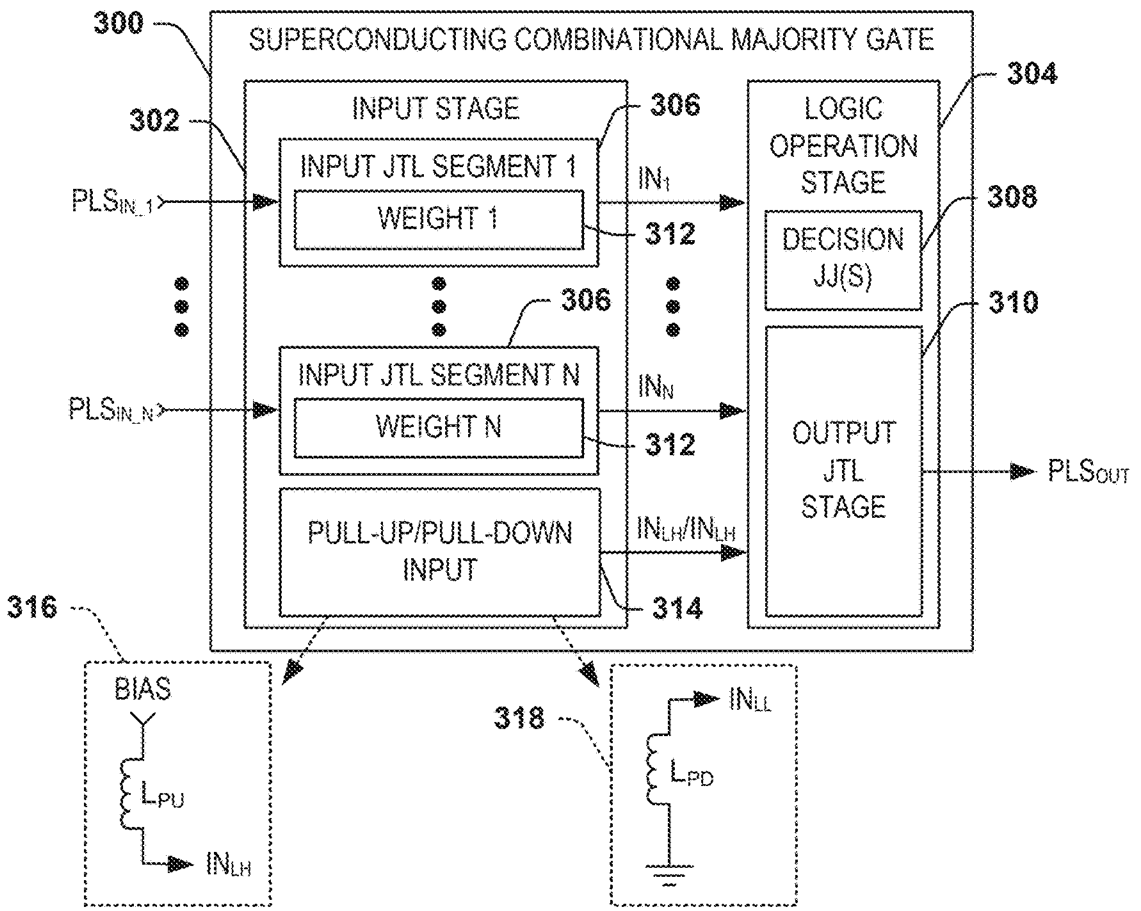
FIG. 3 is an example block diagram of a superconducting gate circuit.

FIG. 3 is another example block diagram of a superconducting gate circuit 300. The superconducting gate circuit 300 can correspond to the superconducting gate circuit 100 in the example of FIG. 1. Therefore, reference is to be made to the example of FIG. 1 in the following description of the example of FIG. 3.

The superconducting gate circuit 300 includes an input stage 302 and a logic operation stage 304. The input stage 302 includes a plurality N of input JTL segments 306, where N is a positive integer, that can each correspond to a separate logical input of the respective superconducting gate circuit. Each of the input JTL segments 306, and thus each of the logical inputs, is configured to receive a logic input signal, demonstrated in the example of FIG. 3 as signals $PLS_{IN\_1}$ through $PLS_{IN\_N}$, respectively. The logic input signals $PLS_{IN\_1}$ through $PLS_{IN\_N}$ can be provided from the respective input JTL segments 306 as signals $IN_1$ through $IN_N$, respectively, to the logic operation stage 304. The logic operation stage 304 includes at least one decision Josephson junction 308 and an output JTL segment 310. Similar to as described above, each of the input JTL segments 306 includes a respective weight 312.

In the example of FIG. 3, the superconducting gate circuit 300 also includes at least one of a pull-up or pull-down input 314. As a first example, the pull-up/pull-down input 314 can be arranged as a pull-up input demonstrated at 316, in which a respective input signal $IN_{LH}$ is provided to the logic operation stage 304 as the bias signal BIAS provided through an inductor $L_{PU}$. The input signal $IN_{LH}$ is thus provided to the logic operation stage 304 as a quasi logic-high signal, and thus tunes the sensitivity of the decision Josephson junction(s) 308. Therefore, based on the input signal $IN_{LH}$, the decision Josephson junction(s) 308 can receive additional bias to provide for a more sensitive triggering of the decision Josephson junction(s) 308, and thus requiring less total flux from the signals $IN_1$ through $IN_N$ to trigger.

As a second example, the pull-up/pull-down input 314 can be arranged as a pull-down input demonstrated at 318, in which a respective input signal $IN_{LL}$ is provided to the logic operation stage 304 as a logic-low (e.g., ground) connection through an inductor $L_{PD}$. The input signal $IN_{LL}$ is thus provided to the logic operation stage 304 as a quasi logic-low signal, and thus tunes the sensitivity of the decision Josephson junction(s) 308. Therefore, based on the input signal $IN_{LL}$, the decision Josephson junction(s) 308 can receive less bias to provide for a less sensitive triggering of the decision Josephson junction(s) 308, and thus requiring more total flux from the signals $IN_1$ through $IN_N$ to trigger.

By providing one or more pull-up/pull-down inputs 314, the superconducting gate circuit 300 can be further tuned to implement the logic function(s) performed by the logic operation stage 304. Thus, the tuning of the decision Josephson junction(s) 308 via the pull-up/pull-down input 314, along with the separate respective weights 312 of the input JTL segments 306 can provide for greater design flexibility of the superconducting gate circuit 300.

Figure 4:
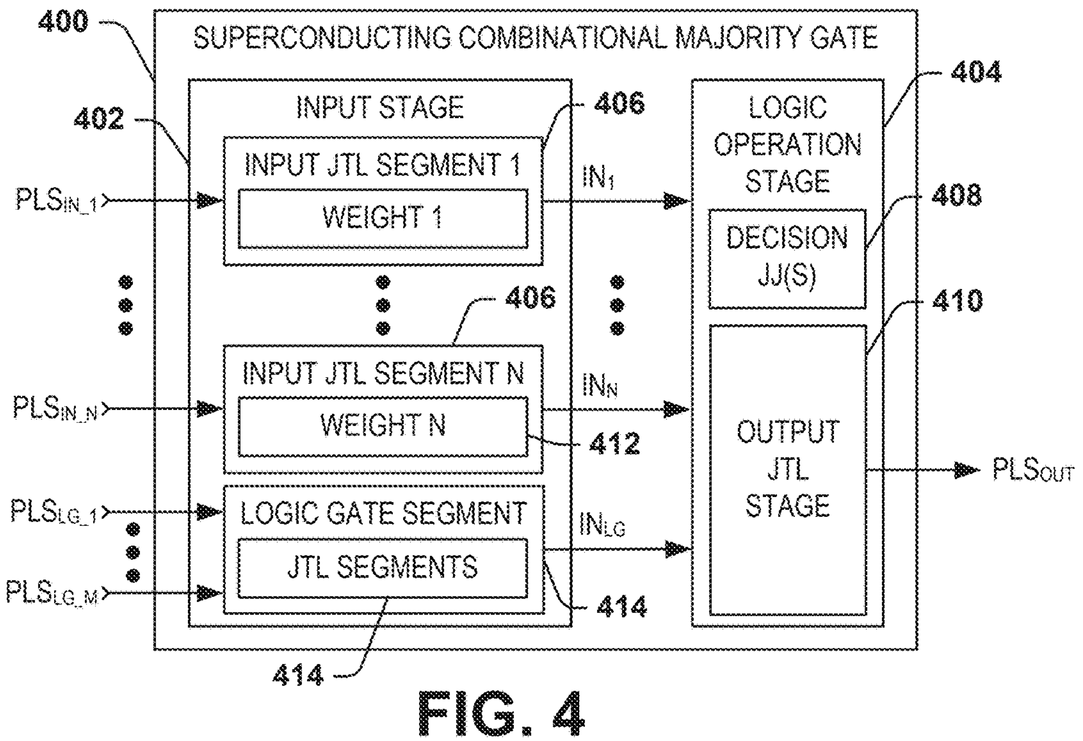
FIG. 4 is another example block diagram of a superconducting gate circuit.

FIG. 4 is another example block diagram of a superconducting gate circuit 400. The superconducting gate circuit 400 can correspond to the superconducting gate circuit 100 in the example of FIG. 1. Therefore, reference is to be made to the example of FIG. 1 in the following description of the example of FIG. 4.

The superconducting gate circuit 400 includes an input stage 402 and a logic operation stage 404. The input stage 402 includes a plurality N of input JTL segments 406, where N is a positive integer, that can each correspond to a separate logical input of the respective superconducting gate circuit. Each of the input JTL segments 406, and thus each of the logical inputs, is configured to receive a logic input signal, demonstrated in the example of FIG. 4 as signals $PLS_{IN\_1}$ through $PLS_{IN\_N}$, respectively. The logic input signals $PLS_{IN\_1}$ through $PLS_{IN\_N}$ can be provided from the respective input JTL segments 406 as signals $IN_1$ through $IN_N$, respectively, to the logic operation stage 404. The logic operation stage 404 includes at least one decision Josephson junction 408 and an output JTL segment 410. Similar to as described above, each of the input JTL segments 406 includes a respective weight 412.

In the example of FIG. 4, the superconducting gate circuit 400 also includes a logic gate segment 414. The logic gate segment 414 can correspond to a plurality of JTL segments 416 that have a combined functionality of an additional logic operation that occurs prior to the logic operation performed by the logic operation stage 404. In the example of FIG. 4, the logic gate segment 414 is demonstrated as receiving a plurality of logic input signals $PLS_{LG\_1}$ through $PLS_{LG\_M}$, where M is a positive integer. The JTL segments 416 can each be weighted relative to each other and relative to the input JTL segments 406 to provide the associated respective logic function of the logic gate segment 414. The output of the logic function of the logic gate segment 414 is demonstrated as a single signal $IN_{LG}$ that is provided to the logic operation stage 404. Therefore, the logic operation stage 404 can implement the associated logic operation based on the inputs $IN_1$ through $IN_N$ and $IN_{LG}$.

As an example, the logic gate segment 414 can be configured to operate as another majority gate. Therefore, the signal $IN_{LG}$ can have the first logic state (e.g., a pulse) in response to a majority of the logic input signals $PLS_{LG\_1}$ through $PLS_{LG\_M}$ having the first logic state (e.g., a pulse), or can have the second logic state (e.g., no pulse) in response to less than a majority of the logic input signals $PLS_{LG\_1}$ through $PLS_{LG\_M}$ having the first logic state (e.g., a pulse).

As another example, the JTL segments 416 can be weighted approximately the same with respect to each other, but can be weighted less than the weights 412 of each of the input JTL segments 406. Therefore, for example, the logic gate segment 414 can perform a logic-AND operation, such that all of the logic input signals $PLS_{LG\_1}$ through $PLS_{LG\_M}$ may be required to have the first logic state (e.g., a pulse) in order to provide the signal $IN_{LG}$ corresponding to a logic-AND output of the logic input signals $PLS_{LG\_1}$ through $PLS_{LG\_M}$. Thus, the signal $IN_{LG}$ can be provided to the logic operation stage 404 as having the same or a different weight relative to the other signals $IN_1$ through $IN_N$.

While the examples are provided above as a majority gate and a logic-AND gate, the logic gate segment 414 can be designed to provide different logic operations, such as different Boolean logic (e.g., OR) operations. As another example, the logic gate segment 414 can have cascaded inputs and/or logic operations, such that multiple logic operations can be provided concurrently or in sequence by the logic gate segment 414 before providing the signal $IN_{LG}$ to the logic operation stage 404. Furthermore, the superconducting gate circuit 400 can include multiple logic gate segments 414 that each provide logic functions on respective logic input signals before providing the signals $IN_{LG}$ to the logic operation stage 404. Accordingly, the superconducting gate circuit 400 can be flexibly designed to reduce the complexity of more complicated logic functions.

Figure 5:
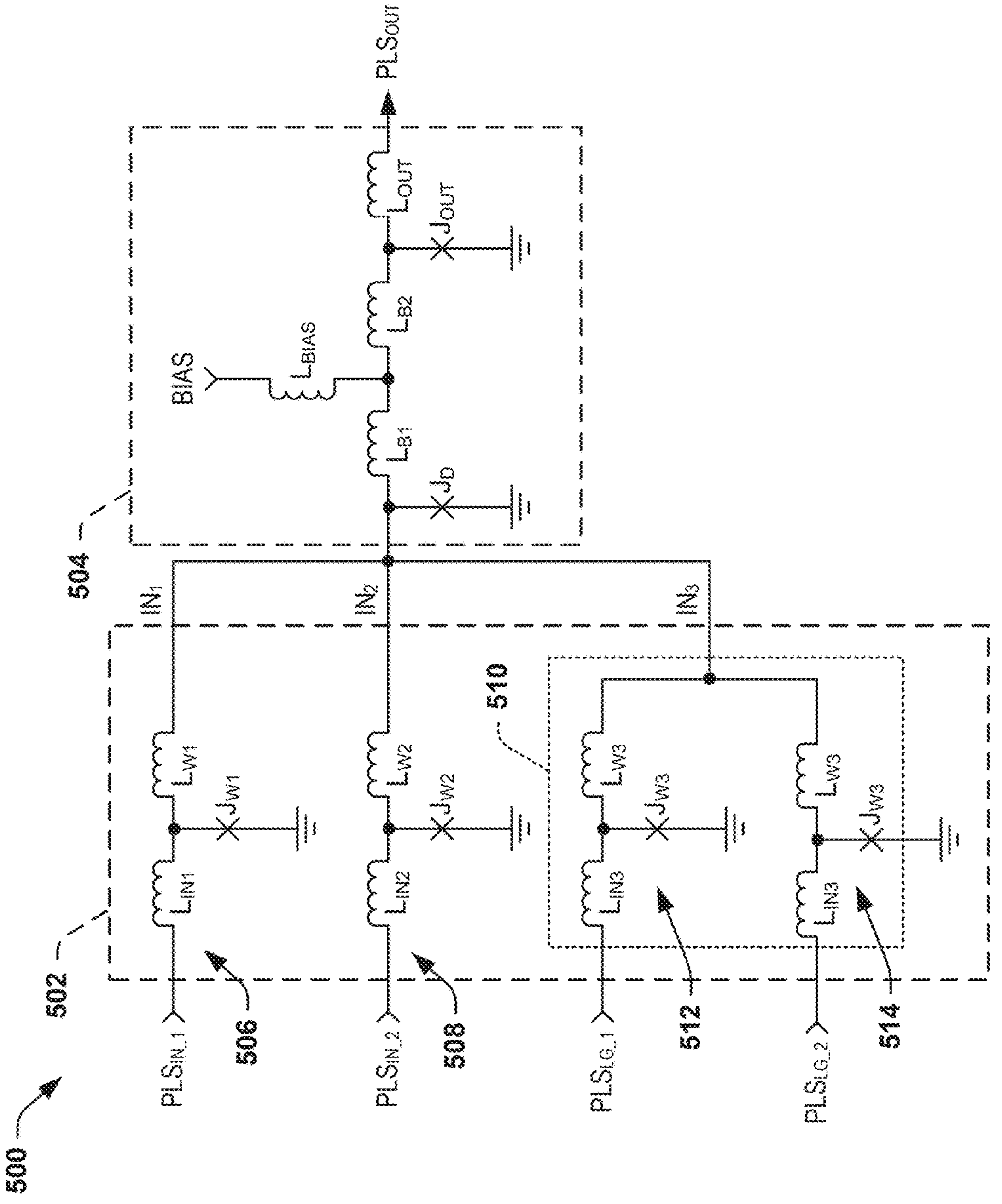
FIG. 5 is another example of a superconducting gate circuit.

FIG. 5 is an example of a superconducting gate circuit 500. The superconducting gate circuit 500 can correspond to the superconducting gate circuit 400 in the example of FIG. 4. Therefore, reference is to be made to the example of FIG. 4 in the following description of the example of FIG. 5.

The superconducting gate circuit 500 include an input stage 502 and a logic operation stage 504. The input stage 502 includes a first input JTL segments 506, a second input JTL segment 508, and a logic gate segment 510. The input JTL segments 506 and 508 are each configured to receive a logic input signal, demonstrated in the example of FIG. 5 as signals $PLS_{IN\_1}$ and $PLS_{IN\_2}$, respectively. The logic gate segment 510 is configured to receive a pair logic input signals, demonstrated in the example of FIG. 5 as signals $PLS_{LG\_1}$ and $PLS_{LG\_2}$ at separate respective logical inputs. As described herein, the logic input signals $PLS_{IN\_1}$, $PLS_{IN\_2}$, $PLS_{LG\_1}$, and $PLS_{LG\_2}$ can each have a first logic state (e.g., presence of a pulse) or a second logic state (e.g., absence of a pulse).

The first input JTL segment 506 includes an input inductor $L_{IN1}$, an input Josephson junction $J_{W1}$, and a storage inductor $L_{W1}$, and the second input JTL segment 508 includes an input inductor $L_{IN2}$, an input Josephson junction $J_{W2}$, and a storage inductor $L_{W2}$. The logic gate segment 510 includes a pair of JTL segments 512 and 514. The first JTL segment 512 includes an input inductor $L_{IN3}$, an input Josephson junction $J_{W3}$, and a storage inductor $L_{W3}$, and the second JTL segment 514 includes an input inductor $L_{IN4}$, an input Josephson junction $J_{W4}$, and a storage inductor $L_{W4}$.

Similar to as described above in the example of FIG. 2, the logic input signal $PLS_{IN\_1}$ having the first logic state (e.g., a pulse) can trigger the input Josephson junction $J_{W1}$ to provide the corresponding signal $IN_1$ at the first logic state (e.g., a pulse), and the logic input signal $PLS_{IN\_2}$ having the first logic state (e.g., a pulse) can trigger the input Josephson junction $J_{W2}$ to provide the corresponding signal $IN_2$ at the first logic state (e.g., a pulse). However, the logic input signals $PLS_{IN\_1}$ and $PLS_{IN\_2}$ having the second logic state (e.g., no pulse) provides no triggering of the respective input Josephson junctions $J_{W1}$ and $J_{W2}$, and thus the signals $IN_1$ and $IN_2$ are provided at the second logic state (e.g., no pulse).

The logic gate segment 510 can operate in a similar manner to the first and second input JTL segments 506 and 508. Therefore, if either of the logic input signals $PLS_{LG\_1}$ or $PLS_{LG\_2}$ have the first logic state (e.g., a pulse), the input Josephson junction $J_{W3}$ can trigger to provide the corresponding signal $IN_3$ at the first logic state (e.g., a pulse). However, if both of the logic input signals PLSLG_1 and $PLS_{LG\_2}$ have the second logic state (e.g., no pulse), neither of the respective input Josephson junctions $J_{W1}$ and $J_{W2}$ trigger, and thus the signal $IN_3$ is provided at the second logic state (e.g., no pulse).

Similar to as described in the example of FIG. 2, the logic operation stage 504 includes a decision Josephson junction $J_D$, and inductor $L_{B1}$, an inductor $L_{B2}$, an output Josephson junction $J_{OUT}$, and an output inductor $L_{OUT}$. A bias signal BIAS is provided to the inductors $L_{B1}$ and $L_{B2}$ through a bias inductor $L_{BIAS}$ to provide a bias to the respective decision and output Josephson junctions $J_D$ and $J_{OUT}$, such that the bias signal BIAS provides a bias to the decision Josephson junction $J_D$. The decision Josephson junction $J_D$ thus triggers based on a combination of the logic states of the signals $IN_1$ through $IN_3$ based on whether the total flux of the signals $IN_1$ through $IN_3$ is sufficient to exceed the critical current of the decision Josephson junction $J_D$.

As described above in the example of FIG. 1, the input JTL segments 506 and 508, and the JTL segments 512 and 514 can be separately respectively weighted. For example, the weight of the input JTL segments 506 and 508, and the JTL segments 512 and 514 can be based on respective critical currents of the input Josephson junctions $J_{W1}$, $J_{W2}$, $J_{W3}$, and $J_{W4}$ and/or the respective inductances of the storage inductors $L_{W1}$, $L_{W2}$, $L_{W3}$, and $L_{W4}$. Therefore, one or more of the input JTL segments 506 and 508, and the JTL segments 512 and 514 can provide a different amount of flux with respect to the signals $IN_1$, $IN_2$, and $IN_3$ in response to triggering of the respective input Josephson junctions $J_{W1}$, $J_{W2}$, $J_{W3}$, and $J_{W4}$. Such disparity in weights of the input JTL segments 506 and 508, and in the JTL segments 512 and 514 of the logic gate segment 510, can provide for varied logic operations of the superconducting gate circuit 500.

As a first example, the weights of the input JTL segments 506 and 508, and the JTL segments 512 and 514 can be approximately the same, and the superconducting gate circuit 500 can be configured as a majority gate, such that any single one of the signals $IN_1$, $IN_2$, and $IN_3$ are insufficient alone to provide enough flux to trigger the decision Josephson junction $J_D$. In the first example, the logic gate segment 510 can operate as a logic-OR gate, such that the signal $IN_3$ has the first logic state (e.g., a pulse) in response to either or both of the input logic signals PLSLG_1 and $PLS_{LG\_2}$ having the first logic state (e.g., a pulse). Therefore, the signal $IN_3$, when combined with either or both of the signals $IN_1$ and $IN_2$, can provide sufficient flux to trigger the decision Josephson junction $J_D$ to provide the logic output signal at the first output logic state (e.g., a pulse).

As a second example, the weights of the input JTL segments 506 and 508 can be approximately the same as each other. The weights of the JTL segments 512 and 514 can also be approximately the same as each other, but can be individually less than the weights of the input JTL segments 506 and 508. For example, the combined weights of the JTL segments 512 and 514 can be approximately the same as the individual weight of each of the input JTL segments 506 and 508. The superconducting gate circuit 500 can be configured as a majority gate, such that any single one of the signals $IN_1$, $IN_2$, and $IN_3$ are insufficient alone to provide enough flux to trigger the decision Josephson junction $J_D$.

In the second example, the logic gate segment 510 can operate as a logic-AND gate. In this example, the signal $IN_3$ has the first logic state (e.g., a pulse) in response to either of the input logic signals PLSLG_1 and $PLS_{LG\_2}$ having the first logic state (e.g., a pulse). However, with only one of the input logic signals PLSLG_1 and $PLS_{LG\_2}$ having the first logic state, the lower weight of the JTL segments 512 and 514 can be such that the signal $IN_3$ can have insufficient flux to trigger the decision Josephson junction $J_D$, even when combined with the flux from one of the other signals $IN_1$ and $IN_2$. However, if both of the input logic signals PLSLG_1 and $PLS_{LG\_2}$ have the first logic state (e.g., a pulse), then the signal $IN_3$ can have sufficient flux to trigger the decision Josephson junction $J_D$ when combined with the flux from one or both of the signals $IN_1$ and $IN_2$. Therefore, because the signal $IN_3$ can only have sufficient flux to trigger the decision Josephson junction $J_D$ when combined with one or both of the signals $IN_1$ and $IN_2$ if both of the input Josephson junctions $J_{W3}$ and $J_{W4}$ trigger, the logic gate segment 510 performs a logic-AND function with respect to the majority gate operation of the superconducting gate circuit 500.

The example of FIG. 5 thus demonstrates the implementation of cascading logic gates from the logical inputs to the output of a superconducting gate circuit. By providing one or more of the logic gate segment 510 between the logical inputs and the logic operation stage 504, more complex logic operations can be performed in a more compact circuit design than the implementation of standalone gate circuits.

Figure 6:
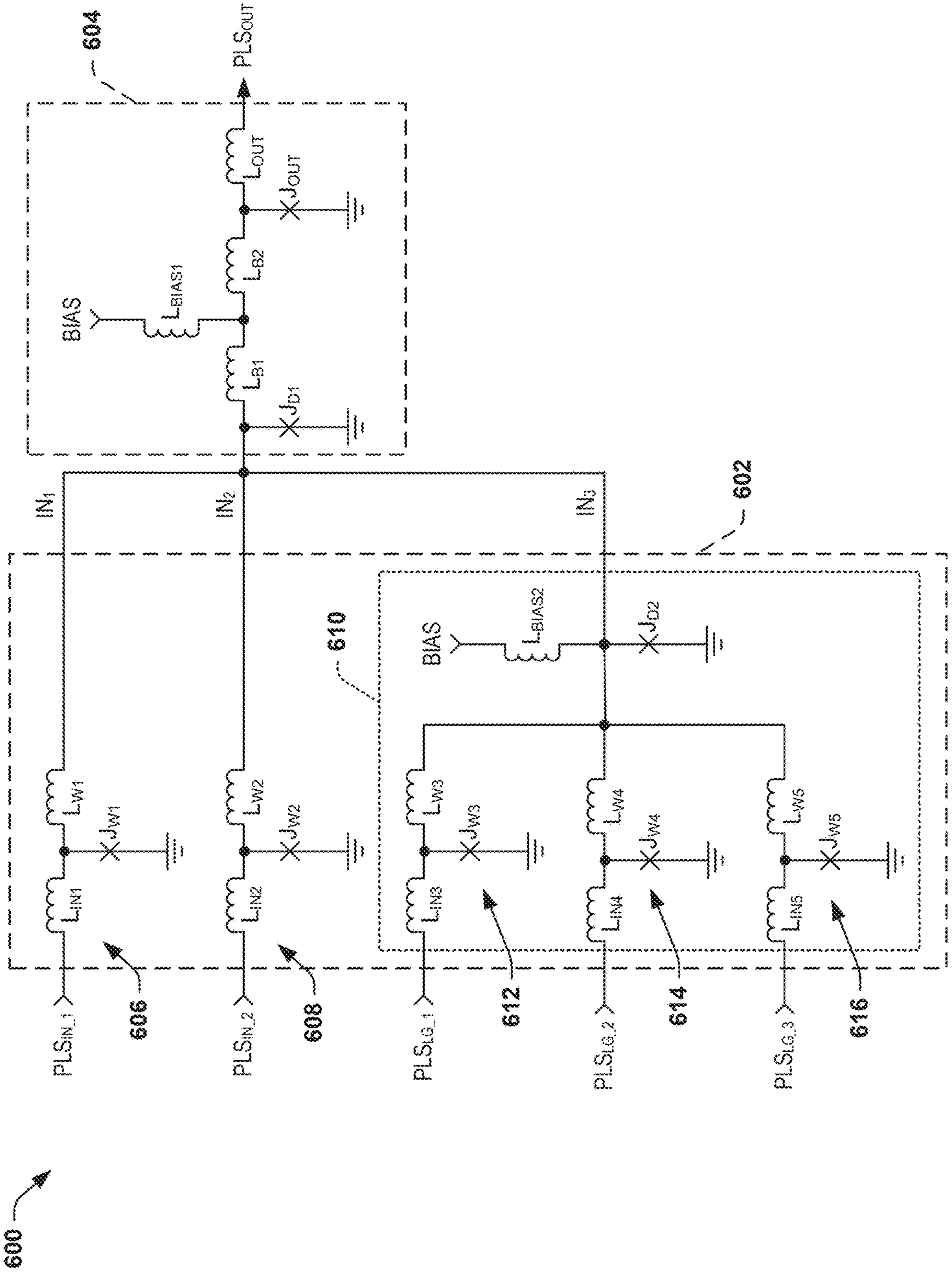
FIG. 6 is another example of a superconducting gate circuit.

FIG. 6 is an example of a superconducting gate circuit 600. The superconducting gate circuit 600 can correspond to the superconducting gate circuit 400 in the example of FIG. 4. Therefore, reference is to be made to the example of FIG. 4 in the following description of the example of FIG. 6.

The superconducting gate circuit 600 include an input stage 602 and a logic operation stage 604. The input stage 602 includes a first input JTL segments 606, a second input JTL segment 608, and a logic gate segment 610. The input JTL segments 606 and 608 are each configured to receive a logic input signal, demonstrated in the example of FIG. 6 as signals $PLS_{IN\_1}$ and $PLS_{IN\_2}$, respectively. The logic gate segment 610 is configured to receive three logic input signals, demonstrated in the example of FIG. 6 as signals PLSLG_1, $PLS_{LG\_2}$, and $PLS_{LG\_3}$ at separate respective logical inputs. As described herein, the logic input signals $PLS_{IN\_1}$, $PLS_{IN\_2}$, PLSLG_1, $PLS_{LG\_2}$, and $PLS_{LG\_3}$ can each have a first logic state (e.g., presence of a pulse) or a second logic state (e.g., absence of a pulse).

The first input JTL segment 606 includes an input inductor $L_{IN1}$, an input Josephson junction $J_{W1}$, and a storage inductor $L_{W1}$, and the second input JTL segment 608 includes an input inductor $L_{IN2}$, an input Josephson junction $J_{W2}$, and a storage inductor $L_{W2}$. The logic gate segment 610 includes three JTL segments 612, 614, and 616. The first JTL segment 612 includes an input inductor $L_{IN3}$, an input Josephson junction $J_{W3}$, and a storage inductor $L_{W3}$. The second JTL segment 614 includes an input inductor $L_{IN4}$, an input Josephson junction $J_{W4}$, and a storage inductor $L_{W4}$. The third JTL segment 616 includes an input inductor $L_{IN5}$, an input Josephson junction $J_{W5}$, and a storage inductor $L_{W5}$.

Similar to as described above in the example of FIG. 2, the logic input signal $PLS_{IN\_1}$ having the first logic state (e.g., a pulse) can trigger the input Josephson junction $J_{W1}$ to provide the corresponding signal $IN_1$ at the first logic state (e.g., a pulse), and the logic input signal $PLS_{IN\_2}$ having the first logic state (e.g., a pulse) can trigger the input Josephson junction $J_{W2}$ to provide the corresponding signal $IN_2$ at the first logic state (e.g., a pulse). However, the logic input signals $PLS_{IN\_1}$ and $PLS_{IN\_2}$ having the second logic state (e.g., no pulse) provides no triggering of the respective input Josephson junctions $J_{W1}$ and $J_{W2}$, and thus the signals $IN_1$ and $IN_2$ are provided at the second logic state (e.g., no pulse).

In the example of FIG. 6, the logic operation stage 604 includes a first decision Josephson junction $J_{D1}$, and inductor $L_{B1}$, an inductor $L_{B2}$, an output Josephson junction $J_{OUT}$, and an output inductor $L_{OUT}$. A bias signal BIAS is provided to the inductors $L_{B1}$ and $L_{B2}$ through a first bias inductor $L_{BIAS1}$ to provide a bias to the respective first decision Josephson junction $J_{D1}$ and the output Josephson junction $J_{OUT}$, such that the bias signal BIAS provides a bias to the first decision Josephson junction $J_{D1}$, such that the first decision Josephson junction $J_{D1}$ can trigger based on a combination of flux of the signals $IN_1$, $IN_2$, and $IN_3$, similar to the superconducting gate circuits 200 and 500 in the respective examples of FIGS. 2 and 5.

However, in the example of FIG. 6, the logic gate segment 610 includes a second decision Josephson junction $J_{D2}$ that is biased by the bias signal BIAS through a second bias inductor $L_{BIAS2}$. The second decision Josephson junction $J_{D2}$ is arranged at the output of the JTL segments 612, 614, and 616, such that the second decision Josephson junction $J_{D2}$ can trigger based on a combination of flux resulting from the triggering of the input Josephson junctions $J_{W3}$, $J_{W4}$, and $J_{W5}$ based on the first logic state (e.g., a pulse) of the logic input signals $PLS_{LG\_1}$, $PLS_{LG\_2}$, and $PLS_{LG\_3}$, respectively. The second decision Josephson junction $J_{D2}$ thus provides the signal $IN_3$. Accordingly, the signal $IN_3$ is provided at the first logic state (e.g., a pulse) in response to triggering of the second decision Josephson junction $J_{D2}$, or is provided at the second logic state (e.g., no pulse) in response to the second decision Josephson junction $J_{D2}$ not triggering.

As an example, the each of the logic gate segment 610 and the logic operation stage 604 can be configured as a majority gate. For example, with respect to the logic operation stage 604, the first decision Josephson junction $J_{D1}$ can have a critical current that is tuned such that the combined flux of at least two of the signals $IN_1$, $IN_2$, and $IN_3$ are sufficient to trigger the first decision Josephson junction $J_{D1}$. Thus, the triggering of the first decision Josephson junction $J_{D1}$ can provide a pulse that is propagated through the output JTL segment 110 formed via the inductors $L_{B1}$ and $L_{B2}$, the output Josephson junction $J_{OUT}$, and the output inductor $L_{OUT}$ as the logic output signal $PLS_{OUT}$ in the first logic state (e.g., a pulse). Conversely, if less than two of the signals $IN_1$, $IN_2$, and $IN_3$ are provided at the second logic state (e.g., no pulse), the combined flux is insufficient to trigger the first decision Josephson junction $J_{D1}$. Thus, no pulse is provided from the first decision Josephson junction $J_{D1}$, and the logic output signal $PLS_{OUT}$ is provided in the second logic state (e.g., no pulse).

With respect to the logic gate segment 610, the second decision Josephson junction $J_{D2}$ can have a critical current that is tuned such that the combined flux of at least two of the logic input signals $PLS_{LG\_1}$, $PLS_{LG\_2}$, and $PLS_{LG\_3}$ are sufficient to trigger the second decision Josephson junction $J_{D2}$. Thus, the triggering of the second decision Josephson junction $J_{D2}$ can provide the signal $IN_3$ as a pulse that is propagated to the logic operation stage 604. Conversely, if less than two of the logic input signals $PLS_{LG\_1}$, $PLS_{LG\_2}$, and $PLS_{LG\_3}$ are provided at the second logic state (e.g., no pulse), the combined flux is insufficient to trigger the second decision Josephson junction $J_{D2}$. Thus, no pulse is provided from the second decision Josephson junction $J_{D2}$, and the signal $IN_3$ is provided in the second logic state (e.g., no pulse).

Accordingly, the superconducting gate circuit 600 can operate as cascaded majority gates. Based on the logic gate segment 610, the logic output signal $PLS_{OUT}$ can be provided based on a majority of: the logic input signals $PLS_{IN\_1}$, $PLS_{IN\_2}$, and a majority of the logic input signals $PLS_{LG\_1}$, $PLS_{LG\_2}$, and $PLS_{LG\_3}$. In other words, the logic output signal $PLS_{OUT}$ is provided in the first logic state (e.g., a pulse) based on a majority of the signals $IN_1$, $IN_2$, and $IN_3$, and the signal $IN_3$ is provided in the first logic state (e.g., a pulse) based on a majority of the logic input signals $PLS_{LG\_1}$, $PLS_{LG\_2}$, and $PLS_{LG\_3}$. The arrangement of the superconducting gate circuit 600 can thus allow for a two bit add operation. Therefore, the superconducting gate circuit 600 can be implemented as an RQL adder in an RQL circuit, as opposed to typical and much more complex RQL adders.

As described above in the example of FIG. 1, the input JTL segments 606 and 608 and the JTL segments 612, 614, and 616 can be separately respectively weighted. For example, the weight of the input JTL segments 606 and 608 and the JTL segments 612, 614, and 616 can be based on respective critical currents of the input Josephson junctions $J_{W1}$, $J_{W2}$, $J_{W3}$, $J_{W4}$, and $J_{W5}$ and/or the respective inductances of the storage inductors $L_{W1}$, $L_{W2}$, $L_{W3}$, $L_{W4}$, and $L_{W5}$. Therefore, one or both of the input JTL segments 606 and 608 can provide a different amount of flux with respect to the signals $IN_1$ and $IN_2$ in response to triggering of the respective input Josephson junctions $J_{W1}$ and $J_{W2}$.

Similarly, the JTL segments 612, 614, and 616 can provide a different amount of flux with respect to the signal $IN_3$ in response to triggering of the respective input Josephson junctions $J_{W3}$, $J_{W4}$, and $J_{W5}$. Such disparity in weights of the input JTL segments 606, 608, and 610 can provide for varied logic operations of the cascaded majority gate function of the superconducting gate circuit 600. As yet another example, the weight of the logic gate segment 610 can be varied, such as by varying the critical current of the second decision Josephson junction $J_{D2}$ and/or by including one or more additional inductors between the logic gate segment 610 and the logic operation stage 604.

The inclusion of the bias signal BIAS provided to the logic gate segment 610 via the second bias inductor $L_{BIAS2}$ can be based on a number of design considerations. For example, the bias signal BIAS can vary the amount of bias to the second decision Josephson junction $J_{D2}$ for triggering the second decision Josephson junction $J_{D2}$, or can provide variable timing for triggering the second decision Josephson junction $J_{D2}$. As an example, the bias signal BIAS can correspond to an RQL clock signal. By providing the RQL clock signal BIAS at the same phase to both the first and second decision Josephson junctions $J_{D1}$ and $J_{D2}$, the second decision Josephson junction $J_{D2}$ can provide sufficient bias to the second decision Josephson junction $J_{D2}$, such that the second decision Josephson junction $J_{D2}$ is better time-aligned to the respective phase. As another example, the RQL clock signal BIAS can be provided at different phases to control timing of operation of cascaded logic operations for a given cascaded superconducting gate circuit. Accordingly, the bias signal BIAS can be selectively applied to portions of the input stage 602 and/or cascaded portions of logic gate segments therein to provide bias and timing control to the respective superconducting gate circuit.

In addition, a given superconducting gate circuit can be fabricated to include a combination of the features of the superconducting gate circuits described herein. For example, the superconducting gate circuits 500 and/or 600 can include a pull-up or pull-down input, such as pull-up/pull-down input 314, in the respective input stages 502 and 602, or in the respective logic gate segments 510 and 610. As another example, the singular logical inputs of the input JTL segments in the respective input stages 502 and 602, or in the respective logic gate segments 510 and 610, can be replaced by other gates, such as majority gates or Boolean logic gates (e.g., AND-gate or OR-gate), as described herein. Additionally, such additional gates can be selectively cascaded to operate in sequence and/or on different clock phases of the RQL clock. Accordingly, a superconducting gate circuit as described herein can be fabricated in a variety of ways.

Figure 7:
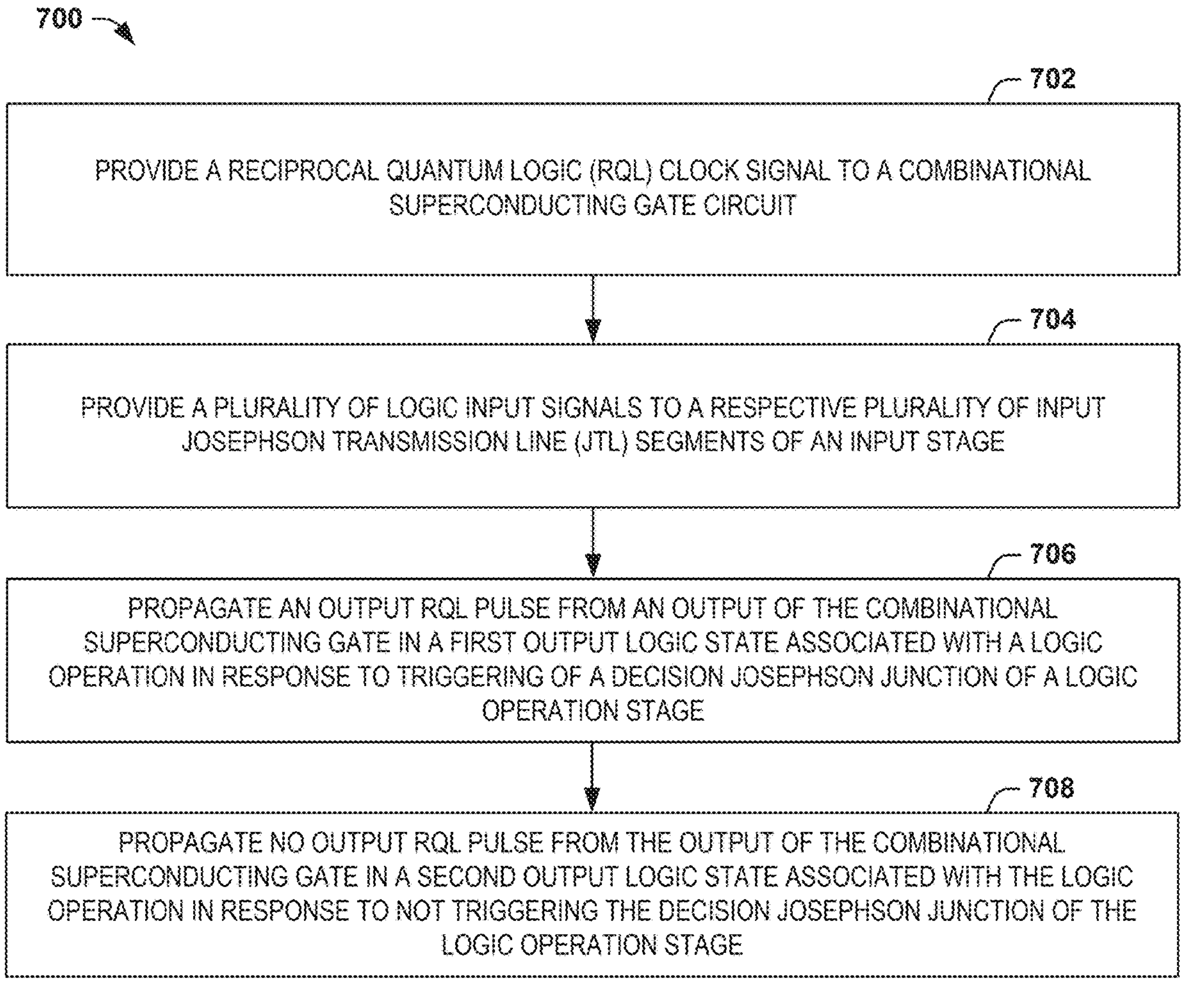
FIG. 7 is an example of a method for performing a logic function.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 is an example of a method 700 for performing a logic function. At 702, an RQL clock signal is provided to a combinational superconducting gate circuit. At 704, a plurality of logic input signals are provided to a respective plurality of input JTL segments of an input stage. The input JTL segments can correspond to a respective plurality of logical inputs of the superconducting gate circuit. Each of the logic input signals can correspond to a presence of an RQL pulse in a first logic state and an absence of the RQL pulse in a second logic state. Each of the logical inputs can be separately weighted in importance based on circuit characteristics associated with each of the respective input JTL segments. At 706, an output RQL pulse is propagated from an output of the combinational superconducting gate in a first output logic state associated with a logic operation in response to triggering of a decision Josephson junction of a logic operation stage. At 708, no output RQL pulse is propagated from an output of the combinational superconducting gate in a second output logic state associated with the logic operation in response to not triggering the decision Josephson junction of the logic operation stage. The first and second output logic states of the logic operation can be provided in response to the respective first or second logic states associated each of the logic input signals and based on the separately weighted logical inputs.

What have been described above are examples. It is, of course, not possible to describe every conceivable combination of components or methodologies for purposes of description, but one of ordinary skill in the art will recognize that many further combinations and permutations are possible. Accordingly, the description is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including"

means including but not limited to. The term "based on" means based at least in part on.

What is claimed is:

1. A combinational superconducting gate circuit comprising:

an input stage comprising a plurality of input Josephson transmission line (JTL) segments corresponding to a respective plurality of logical inputs, each of the logical inputs being configured to receive a respective logic input signal having a first logic or a second logic state, each of the logical inputs being separately weighted in importance based on circuit characteristics associated with each of the respective input JTL segments; and a logic operation stage comprising a first decision Josephson junction, the logic operation stage being configured perform a first logic operation based on a combination of the first and second logic states of the logic input signals associated with the respective logical inputs, such that the first decision Josephson junction is configured to trigger to provide a logic output signal having a first output logic state based on the logic operation or to not trigger to provide a logic output signal having a second logic output state based on the logic operation, and further comprising a second decision Josephson junction associated with a proper subset of the logical inputs, the second decision Josephson junction being configured to trigger in a first output state associated with a second logic operation or to not trigger in a second output state associated with the second logic operation based on the combination of the first and second logic states of the proper subset of the logical inputs.

2. The circuit of claim 1, wherein each of the input JTL segments comprises an input Josephson junction and a storage inductor, wherein each of the logical inputs is weighted based on circuit characteristics of at least one of the input Josephson junction and the storage inductor.

3. The circuit of claim 2, wherein each of the logical inputs is weighted based on at least one of a critical current of the input Josephson junction and an inductance of the storage inductor.

4. The circuit of claim 1, wherein each of the input JTL segments comprises a plurality of input Josephson junctions and a plurality of storage inductors, wherein each of the logical inputs is weighted based on a quantity of the input Josephson junctions and the storage inductors.

5. The circuit of claim 1, wherein the first logic operation performed by the logic operation stage is a modified majority gate operation based on a respective weight of each of the logical inputs.

6. The circuit of claim 1, wherein one of the logical inputs is coupled to a bias current source via an inductor to statically set the respective one of the logical inputs to the first logic state or is coupled to a low-voltage rail via the inductor to statically set the respective one of the logical inputs to the second logic state to tune a critical current of the decision Josephson junction.

7. The circuit of claim 1, wherein the superconducting gate circuit is a reciprocal quantum logic (RQL) gate circuit, wherein each of the logical inputs is configured to receive the respective logic input signal as an RQL input pulse in the first logic state and to not receive the respective RQL input pulse in the second logic state, wherein the decision Josephson junction is configured to trigger to provide an RQL output pulse as the logic output signal in the first output logic state based on the logic operation or to not trigger to not provide the RQL output pulse as the logic output signal in the second output logic state based on the logic operation.

8. A method comprising:

providing a reciprocal quantum logic (RQL) clock signal to a combinational superconducting gate circuit;

providing a plurality of logic input signals to a respective plurality of input Josephson transmission line (JTL) segments of an input stage, the input JTL segments corresponding to a respective plurality of logical inputs of the superconducting gate circuit, each of the logic input signals corresponding to a presence of an RQL pulse in a first logic state and an absence of the RQL pulse in a second logic state, each of the logical inputs being separately weighted in importance based on circuit characteristics associated with each of the respective input JTL segments, wherein providing the plurality of logic input signals to the plurality of logical inputs comprises:

providing a first set of the plurality of logic input signals to a proper subset of the logical inputs arranged to provide a second logic operation on the first set of logic input signals based on a weight associated with each logical input of the proper subset of the logical inputs; and providing a second set of the plurality of logic input signals to remaining logical inputs, such that the first and second output logic states of the logic operation are provided in response to an output of the second logic operation and the respective first or second logic states of the second set of the logic input signals and based on the separately weighted logical inputs;

propagating an output RQL pulse from an output of the combinational superconducting gate in a first output logic state associated with a first logic operation in response to triggering of a decision Josephson junction of a logic operation stage; and propagating no output RQL pulse from the output of the combinational superconducting gate in a second output logic state associated with the first logic operation in response to not triggering the decision Josephson junction of the logic operation stage;

wherein the first and second output logic states of the first logic operation are provided in response to the respective first or second logic states associated each of the logic input signals and based on the separately weighted logical inputs.

9. The method for claim 8, wherein each of the input JTL segments comprises an input Josephson junction and a storage inductor, wherein each of the logical inputs is weighted based on at least one of a critical current of the input Josephson junction and an inductance of the storage inductor.

10. The method for claim 8, wherein providing the plurality of logic input signals comprises providing one of the logical inputs as a bias current source coupled via an inductor to statically provide the respective one of the logic input signals to the first logic state or as a low-voltage rail coupled via the inductor to statically provide the respective one of the logic input signals to the second logic state to tune a critical current of the decision Josephson junction.

11. A combinational reciprocal quantum logic (RQL) gate circuit comprising:

an input stage comprising a plurality of input Josephson transmission line (JTL) segments corresponding to a respective plurality of logical inputs, each of the input JTL segments comprising an input Josephson junction and a storage inductor, each of the logical inputs being configured to receive a respective RQL input pulse in a first logic state and to not receive the respective RQL input pulse in a second logic state, each of the logical inputs being separately weighted in importance based on at least one of a critical current of the input Josephson junction and an inductance of the storage inductor of the respective one of the input JTL segments; and a logic operation stage comprising a decision Josephson junction, the logic operation stage being configured perform a logic operation based on a combination of the first and second logic states associated with the respective logical inputs, such that the decision Josephson junction is configured to trigger to provide an RQL output pulse in a first output logic state associated with the logic operation or to not trigger to not provide the RQL output pulse in a second output logic state associated with the logic operation;

wherein the logic operation performed by the logic operation stage is a first modified majority gate operation based on a respective weight of each of the logical inputs, wherein a proper subset of the logical inputs are arranged to provide a second modified majority gate operation on the proper subset of the logical inputs based on the respective weight associated with each logical input of the proper subset of the logical inputs, such that an output of the second modified majority gate operation is provided to the logic operation stage as an input for the first modified majority gate operation.

12. The circuit of claim 11, wherein one of the logical inputs is coupled to a bias current source via an inductor to statically set the respective one of the logical inputs to the first logic state or is coupled to a low-voltage rail via the inductor to statically set the respective one of the logical inputs to the second logic state to tune a critical current of the decision Josephson junction.

* * * * *